(12) United States Patent
Yamazaki et al.

(10) Patent No.: US 6,433,363 B1
(45) Date of Patent: Aug. 13, 2002

(54) SEMICONDUCTOR DEVICE AND MANUFACTURING METHOD THEREOF

(75) Inventors: Shunpei Yamazaki, Tokyo; Hisashi Ohtani, Kanagawa; Hideto Ohnuma, Kanagawa; Satoshi Teramoto, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/030,727

(22) Filed: Feb. 23, 1998

(30) Foreign Application Priority Data

Feb. 24, 1997 (JP) ............................................. 9-055632

(51) Int. Cl.$^7$ ............................................. H01L 29/76
(52) U.S. Cl. ............................. 257/66; 257/57; 257/59; 257/72; 257/408; 257/607
(58) Field of Search ............................. 257/57, 59, 66, 257/72, 408, 607

(56) References Cited

U.S. PATENT DOCUMENTS

| | | | |
|---|---|---|---|
| 4,258,465 A | * 3/1981 | Yasui et al. | 257/408 |
| 5,403,772 A | 4/1995 | Zhang et al. | 437/101 |
| 5,424,229 A | * 6/1995 | Oyamatsu | 437/35 |
| 5,426,064 A | 6/1995 | Zhang et al. | 437/40 |
| 5,481,121 A | 1/1996 | Zhang et al. | 257/64 |
| 5,488,000 A | 1/1996 | Zhang et al. | 437/21 |
| 5,492,843 A | 2/1996 | Adachi et al. | 437/21 |
| 5,501,989 A | 3/1996 | Takayama et al. | 437/21 |
| 5,508,533 A | 4/1996 | Takemura | 257/64 |
| 5,529,937 A | 6/1996 | Zhang et al. | 437/10 |
| 5,534,716 A | 7/1996 | Takemura | 257/72 |
| 5,543,352 A | 8/1996 | Ohtani et al. | 437/101 |
| 5,563,426 A | 10/1996 | Zhang et al. | 257/66 |
| 5,569,610 A | 10/1996 | Zhang et al. | 437/21 |
| 5,569,936 A | 10/1996 | Zhang et al. | 257/66 |
| 5,580,792 A | 12/1996 | Zhang et al. | 437/10 |
| 5,585,291 A | 12/1996 | Ohtani et al. | 437/40 |
| 5,589,694 A | 12/1996 | Takayama et al. | 257/67 |
| 5,595,923 A | 1/1997 | Zhang et al. | 437/41 |
| 5,595,944 A | 1/1997 | Zhang et al. | 437/41 |
| 5,604,360 A | 2/1997 | Zhang et al. | 257/72 |
| 5,605,846 A | 2/1997 | Ohtani et al. | 437/21 |
| 5,606,179 A | 2/1997 | Yamazaki et al. | 257/59 |
| 5,608,232 A | 3/1997 | Yamazaki et al. | 257/66 |
| 5,612,250 A | 3/1997 | Ohtani et al. | 437/101 |
| 5,614,426 A | 3/1997 | Funada et al. | 437/40 |
| 5,614,733 A | 3/1997 | Zhang et al. | 257/66 |
| 5,616,506 A | 4/1997 | Takemura | 438/150 |
| 5,621,224 A | 4/1997 | Yamazaki et al. | 257/66 |
| 5,624,851 A | 4/1997 | Takayama et al. | 438/166 |
| 5,637,515 A | 6/1997 | Takemura | 438/162 |
| 5,639,698 A | 6/1997 | Yamazaki et al. | 437/228 |
| 5,643,826 A | 7/1997 | Ohtani et al. | 437/88 |
| 5,646,424 A | 7/1997 | Zhang et al. | 257/66 |
| 5,654,203 A | 8/1997 | Ohtani et al. | 438/97 |
| 5,663,077 A | 9/1997 | Adachi et al. | 438/151 |
| 5,700,333 A | 12/1997 | Yamazaki et al. | 136/258 |
| 5,830,784 A | 11/1998 | Zhang et al. | 438/154 |
| 5,843,225 A | 12/1998 | Takayama et al. | 117/8 |
| 5,859,443 A | 1/1999 | Yamazaki et al. | 257/65 |
| 5,869,363 A | * 2/1999 | Yamazahi et al. | 438/166 |
| 5,888,858 A | * 3/1999 | Yamazaki et al. | 438/162 |
| 5,889,292 A | * 3/1999 | Sameshima et al. | 257/616 |
| 5,891,782 A | * 4/1999 | Hsu et al. | 438/302 |
| 5,897,347 A | 4/1999 | Yamazaki et al. | 438/166 |

(List continued on next page.)

Primary Examiner—Mark V. Prenty
(74) Attorney, Agent, or Firm—Fish & Richardson P.C.

(57) ABSTRACT

Regions 221–224 to become source and drain regions are doped with phosphorus and a heat treatment is then performed, whereby a metal element is moved, with priority, from regions 227–230 to the regions 221–224. Low-concentration impurity regions are thereafter formed in the regions 227–230. As a result, variations in the characteristics of TFTs can be reduced and their reliability can be improved.

85 Claims, 7 Drawing Sheets

U.S. PATENT DOCUMENTS

| | | | |
|---|---|---|---|
| 5,915,174 A | 6/1999 | Yamazaki et al. | 438/166 |
| 5,952,708 A * | 9/1999 | Yamazaki | 257/59 |
| 5,953,597 A | 9/1999 | Kusumoto et al. | 438/161 |
| 5,961,743 A | 10/1999 | Yamazaki et al. | 136/258 |
| 5,977,559 A | 11/1999 | Zhang et al. | 257/57 |
| 5,985,740 A * | 11/1999 | Yamazaki et al. | 438/486 |
| 5,990,542 A | 11/1999 | Yamazaki | 257/642 |
| 6,251,712 B1 * | 6/2001 | Tanaka et al. | 438/143 |

* cited by examiner

SEMICONDUCTOR DEVICE AND MANUFACTURING METHOD THEREOF

BACKGROUND OF THE INVENTION

1. Field of the Invention

The present invention relates to a thin-film transistor and its manufacturing method as well as to circuits and apparatuses constituted by using thin-film transistors.

2. Description of the Related Art

The thin-film transistor (hereinafter abbreviated as "TFT") using a thin-film semiconductor is known. This is formed on a substrate by using a thin-film semiconductor, particularly a silicon semiconductor film.

The TFT is used in various kinds of integrated circuits, particularly the active matrix liquid crystal display device. In the active matrix liquid crystal display device, TFTs as switching elements are provided for respective pixel electrodes that are arranged in matrix form. There is known a version (called "peripheral driver circuits integrated type") in which not only a matrix circuit but also peripheral driver circuits are constituted by using TFTs.

Examples of other uses of the TFT are various kinds of integrated circuits and multilayered integrated circuits (three-dimensional ICs).

As for a silicon film used in the TFT, it is simple and convenient to use an amorphous silicon film formed by a vapor-phase method such as plasma CVD. It can be said that this method has already been established almost completely.

However, the electrical characteristics of the TFT using an amorphous silicon film are far lower than those of the TFT using a single crystal semiconductor for common semiconductor integrated circuits. Therefore, at present, this type of TFT can be used for only limited purposes such as a switching element of an active matrix circuit.

The characteristics of a TFT using an amorphous silicon film can be improved by converting the amorphous silicon film into a crystalline silicon film. Silicon films having crystallinity other than a single crystal silicon film are called a polysilicon film, a microcrystal silicon film, etc.

Such a silicon film having crystallinity can be obtained by forming an amorphous silicon film and crystallizing it by heating (thermal annealing). This method is called a solid-phase growth method because conversion from an amorphous state to a crystal state is effected while the solid phase is maintained.

However, the silicon solid-phase growth has problems that the heating temperature and time need to be set at more than 600° C. and more than 10 hours, respectively, and that it is difficult to use an inexpensive glass substrate.

For example, the Corning 7059 glass, which is commonly used in the active matrix liquid crystal display device, has a glass strain point of 593° C. Therefore, in view of increasing the substrate area, it is problematic to subject this glass to thermal annealing of more than 600° C. for a long time.

Further, the fact that the heating time for crystallization is more than 10 hours is problematic in terms of productivity.

To solve the above problems, the inventors have developed a technique in which a certain kind of metal element such as nickel or palladium is deposited, by a very small amount, on the surface of an amorphous silicon film and then heating is performed. According to this technique, crystallization can be completed by performing heating at 550° C. for about 4 hours (refer to Japanese Unexamined Patent Publication No. 6-244103 (JP-A-6-244103).

Naturally a silicon film even higher in crystallinity can be obtained by annealing of 600° C. and 4 hours.

This technique can produce a large-area crystalline silicon film on an inexpensive glass substrate with high productivity.

To introduce a very small amount of metal element (for accelerating crystallization), various methods are available such as depositing a coating of a metal element or its compound by sputtering (refer to JP-A-6-244104), forming a coating of a metal element or its compound by such a means as spin coating (JP-A-7-130652), and forming a coating by decomposing a gas containing a metal element by thermal decomposition, plasma decomposition, or the like (JP-A-7-335548).

It is also possible to introduce a metal element selectively, i.e., into a particular portion, and then cause crystal growth to proceed from the portion where the metal element is introduced to the periphery (called "lateral growth method"). Having directivity in crystal structure, a crystalline silicon film produced by this method exhibits much superior characteristics when used properly in connection with the directivity.

Although the above-described methods of forming a crystalline silicon film by using a certain kind of metal element (for instance, nickel) are much superior, it is known that they cause the following problems when a TFT is formed by using such a crystalline silicon film.

Figure 1:
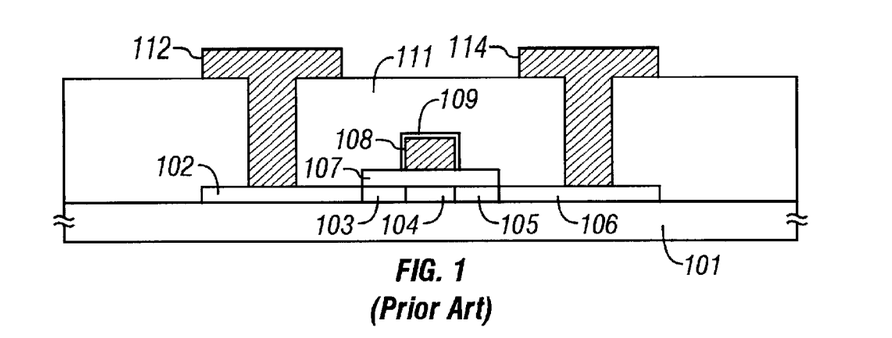
FIG. 1 shows the structure of a conventional thin-film transistor.

First, the structure of a common TFT will be described. FIG. 1 shows the structure of a typical n-channel TFT.

In the structure of FIG. 1, an active layer including a source region 102, a low-concentration impurity region 103, a channel region 104, a low-concentration impurity region (LDD region) 105, and a drain region 106 is provided on a glass substrate 101. Reference numerals 111, 112, and 114 denote an interlayer insulating film, a source electrode, and a drain electrode, respectively.

The TFT structure as shown in FIG. 1 is generally employed in which the low-concentration impurity region 105 that is less conductive than the drain region 106 is provided on the drain side, particularly in n-channel TFTs. The region 105, which is called an LDD (lightly doped drain) region, such roles as reducing a strong electric field applied between the channel region and the drain region, reducing the leak current, and suppressing the hot carrier effect.

The following problems arise when a TFT having the above structure is formed by using a crystalline silicon film that has been crystallized by utilizing a particular metal element of the above kind.

A TFT formed by using a crystalline silicon film that has been obtained by utilizing a metal element exhibits much superior characteristics as a whole; for instance, it is even superior to a TFT formed by using a crystalline silicon film that has been obtained by irradiation with laser light.

However, the case of utilizing a metal element is associated with a problem that the characteristics vary to a large extent when a number of TFTs are produced. Further, TFTs having marked deteriorations in characteristics are found though the rate of occurrence is low. These deteriorations in characteristics increase variations in device characteristics as a group of TFTs.

The variations in device characteristics are a serious problem in making an integrated circuit. In general, in making an integrated circuit, it is important that the characteristics be uniform among devices used as well as the characteristics of each device be superior.

SUMMARY OF THE INVENTION

An object of the invention is to provide a technique for obtaining a TFT having small variations in device characteristics in forming it by using a crystalline silicon film that has been obtained by utilizing a metal element.

According to knowledge of the inventors, the variations in device characteristics are caused by the metal element that was used in the crystallization, which means that the problem of the variations in device characteristics can be eliminated by removing the metal element selectively from a crystalline silicon film obtained.

Studies of the inventors have revealed that where the nickel element is used, it can be removed (or its influences can be eliminated) by performing, on a crystalline silicon film obtained, a heat treatment at more than about 900° C. in an oxygen atmosphere containing chlorine at several percent.

By utilizing this technique, a TFT having superior characteristics can be obtained with vary small variations in characteristics. A patent application has already been filed for this technique (Japanese Patent Application No. 8-335152).

However, this technique still has a problem that an inexpensive glass substrate cannot be used because heating at more than 900° C. is needed to remove the nickel element.

To enable use of inexpensive glass substrates (for instance, the Corning 7059 glass substrate and the Corning 1737 glass substrate), it is desirable that the process temperature be lower than 600° C.

Experiments of the inventors have revealed that the following method is effective in removing the nickel element by a heat treatment of as low a temperature as about 600° C. (which is a low temperature when compared with 900° C.):

(1) First, while part of a crystalline silicon film that has been obtained by the action of a metal element is left, phosphorus ions are accelerated and implanted into the other portion.

(2) Then, a heat treatment of about 600° C. is performed.

As a result, the metal element is moved to the phosphorus-ions-implanted region as if it were sucked out.

However, the removal of the metal element by the above method utilizes a phenomenon that the metal element is moved parallel with the film surface rather than it is moved perpendicularly to and removed through the film surface. Therefore, the metal element is gradually moved from a peripheral portion of a subject pattern to the region where phosphorus ions are implanted, wherein said subject pattern is a region where the phosphorus ions are not implanted into.

Therefore, this method is not suitable for removal of a metal element from the entire subject pattern when the subject pattern has a large area.

On the other hand, concentrated studies of the inventors on the influences of metal elements on the TFT characteristics have led to knowledge that the variations and deteriorations in device characteristics of a TFT that has been formed by using a crystalline silicon film crystallized by utilizing a metal element are greatly influenced by the metal element remaining in a region where a strong electric field is to be applied.

In the TFT shown in FIG. 1, the strongest electric field is applied to the drain-side low-concentration impurity region 105. Therefore, the variations and deteriorations in device characteristics of the TFT can be reduced by decreasing the concentration of a metal element in the region 105.

In the invention, the above-mentioned technique of accelerating and implanting phosphorus ions is used to reduce the concentration of a metal element in the drain-side low-concentration impurity region 105.

Figure 4A:
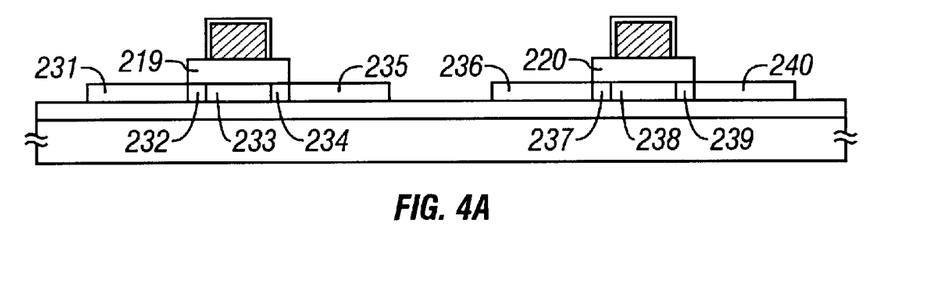
Figure 4B:
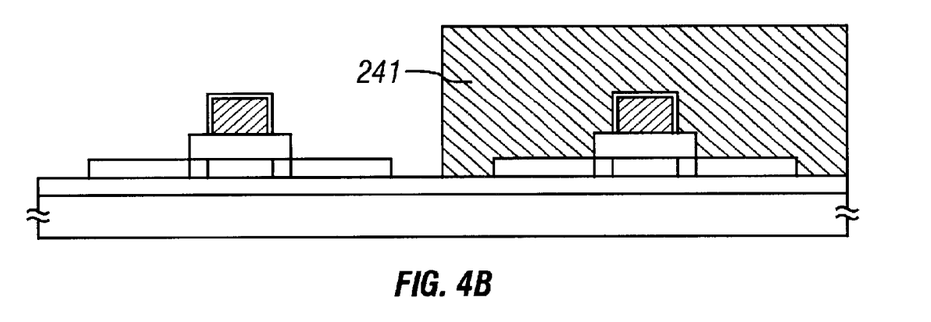
Figure 4C:
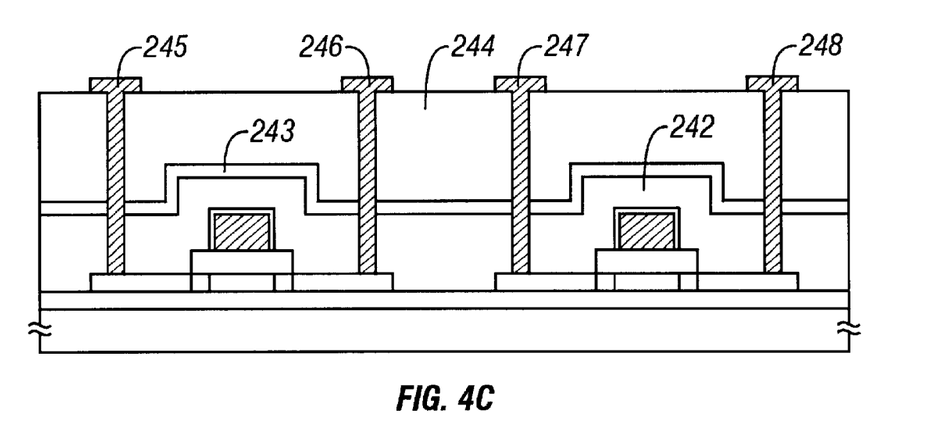

According to one aspect of the invention, there is provided a semiconductor device (a specific structure is shown in FIGS. 4A and 4C) having an active layer formed by a crystalline silicon film that has been crystallized by utilizing a metal element for accelerating crystallization of silicon, wherein a channel region 238, a drain region 236, and a low-concentration impurity region (in other words; a lightly doped drain region) 237 are formed in the active layer; the low-concentration impurity region 237 is formed between the channel region 238 and the drain region 236, and is doped with an impurity for imparting conductivity at a lower concentration than the drain region 236; and a concentration of the metal element in the low-concentration impurity region 237 is ⅕ (one fifth) or less of that in the drain region 236.

Where the semiconductor device is a p-channel TFT, the drain region has p-type conductivity and the low-concentration impurity region has lower p-type conductivity than the drain region, and wherein the drain region is doped with phosphorus. In this case, although the drain region has p-type conductivity, it is also doped with phosphorus for gettering the metal element.

It is preferred that the metal element for accelerating the crystallization is nickel. This is because nickel is superior in both effect and reproducibility.

The metal element may be one or a plurality of elements selected from Fe, Co, Ni, Ru, Rh, Pd, Os, Ir, Pt, Cu, and Au.

According to another aspect of the invention, there is provided a manufacturing method of a semiconductor device, comprising the steps of forming a crystalline silicon film by utilizing a metal element for accelerating crystallization of silicon (see FIGS. 2A and 2B); doping, with phosphorus, at least a first region (221–224) to become a drain region of a thin-film transistor (see FIG. 3C); performing a heat treatment, to thereby cause the metal element existing in a second region (227–230) adjacent to the first region to be gettered in the first region (see FIG. 3D); and forming a low-concentration impurity region (a lightly doped drain region) in the second region by doping the second region with an impurity for imparting conductivity at a lower concentration than the first region (see FIG. 4A and/or FIG. 4B).

This manufacturing process can attain the object of the invention by making the concentration of the metal element in the low-concentration impurity region ⅕ (one fifth) or less of that in the drain region.

Plasma doping and ion implantation in which ions of a dopant element are accelerated and implanted are typically used as a doping method.

Other usable doping methods include a method in which a thin film of a dopant element is formed on the surface of a region to be doped, a method in which a desired region is doped by exposing a sample to a plasma atmosphere containing a dopant element, a method in which a sample is illuminated with laser light in an atmosphere containing a dopant element, and a method in which a dopant element is caused to diffuse into a particular region of a film by applying a solution containing the dopant element to the film.

DETAILED DESCRIPTION OF THE PREFERRED EMBODIMENTS

Embodiment 1

FIGS. 2A–2D, FIGS. 3A–3D and FIGS. 4A–4C show a manufacturing process according to this embodiment. This embodiment is directed to a manufacturing process for forming a p-channel TFT (PTFT) and an n-channel TFT (NTFT) at the same time. A complementary combination of a PTFT and an NTFT is commonly used as a fundamental element in integrated circuits.

Figure 2A:
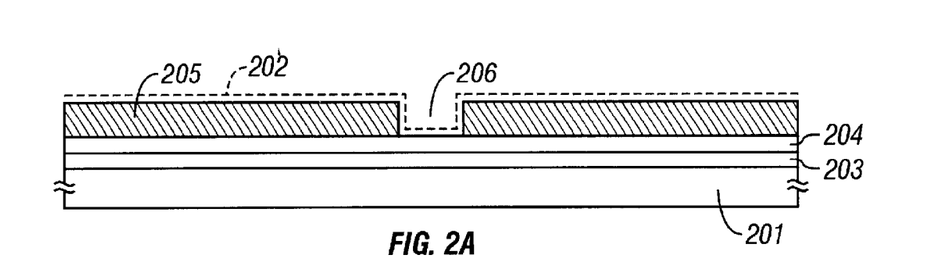
FIGS. 2A–2D, 3A–3D and 4A–4C show a manufacturing process of a thin-film transistor according to a first embodiment of the present invention.

First, as shown in FIG. 2A, a 3,000-Å-thick silicon oxide film 203 as an undercoat film is formed on a glass substrate 201 by sputtering. The glass substrate 201 is a Corning 1737 substrate (strain point: 667° C.), for instance.

After the formation of the undercoat film, a 700-Å-thick amorphous silicon film 204 is formed by plasma CVD (or low-pressure thermal CVD). Alternatively, an amorphous film of $Si_xGe_{1-x}$ may be used.

Then, a 1,500-Å-thick silicon oxide film is formed by plasma CVD and patterned into a mask 205. The mask 205 has an opening 206 where part of the amorphous silicon film 204 is exposed. The opening 206 is shaped like a long and narrow slit extending in the direction perpendicular to the paper surface.

After the formation of the mask 205, a nickel acetate salt solution in which the density of the nickel element is adjusted to 10 ppm (in terms of weight) is applied. An excessive part of the solution is removed with a spin coater.

In this state, the nickel element is held in contact with the surface as indicated by numeral 202 in FIG. 2A. That is, the nickel element is provided adjacent to the surface of the amorphous silicon film 204 in the region of the opening 206 of the mask 205.

Alternatively, a metal element may be introduced by ion implantation.

Figure 2B:
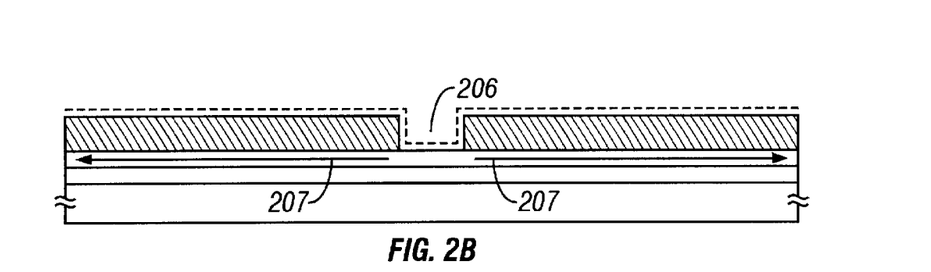

A heat treatment is then performed at 600° C. for 4 hours in a nitrogen atmosphere, during which crystal growth proceeds from the region of the opening 206 in directions 207 (see FIG. 2B).

Since this crystal growth proceeds parallel with the substrate 201, it is called a lateral growth. It is considered that this crystal growth proceeds as the nickel element diffuses.

Figure 2C:
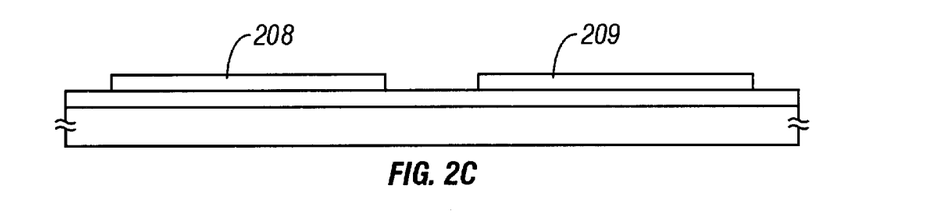

After completion of the crystallization that is shown in FIG. 2B, patterns 208 and 209 are formed by using the crystal-grown region as shown in FIG. 2C. The patterns 208 and 209 will become the active layers of a PTFT and an NTFT, respectively.

Figure 2D:
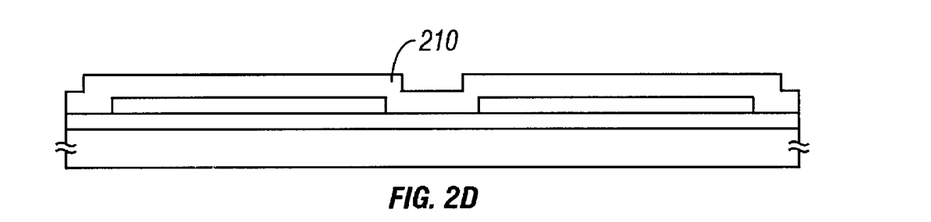

A 1,300-Å-thick silicon oxide film 210 is then formed which will serve as a gate insulating film (see FIG. 2D).

Figure 3A:
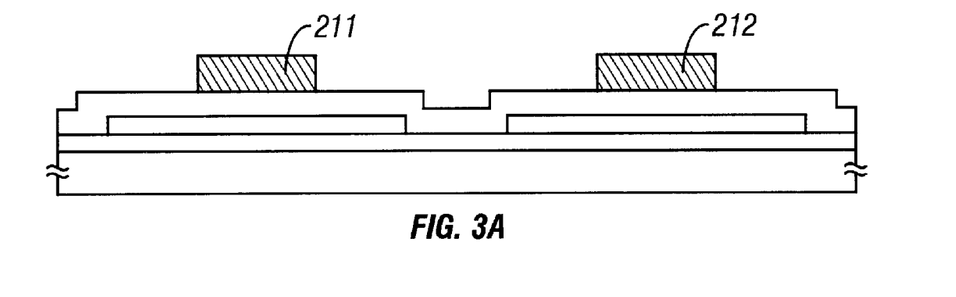

Thereafter, a 4,000-Å-thick aluminum film (not shown) is formed by sputtering and patterned into patterns 211 and 212 (see FIG. 3A).

Porous anodic oxide films 213 and 214 are then formed by performing anodization with the aluminum patterns 211 and 212 as the anodes. The growth length of the anodic oxide films 213 and 214 is set at 5,000 Å.

The anodization is performed in a state that a resist mask that was used in forming the aluminum patterns 211 and 212 is left. This allows oxide films to grow in selected directions, i.e., sideways, to form the patterns 213 and 214.

Porous anodic oxide films can be grown by using, as an electrolyte, an aqueous solution containing oxalic acid at 3%.

Figure 3B:
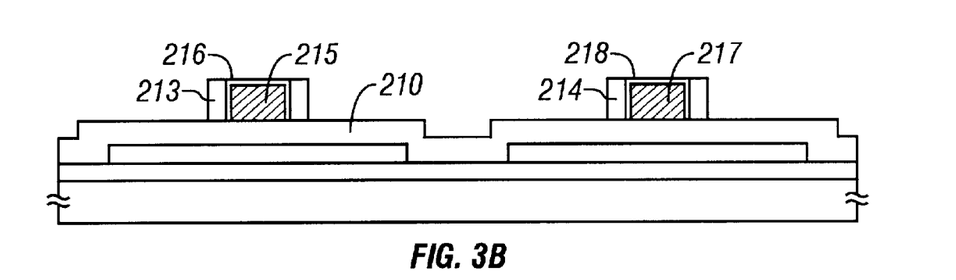
Figure 3C:
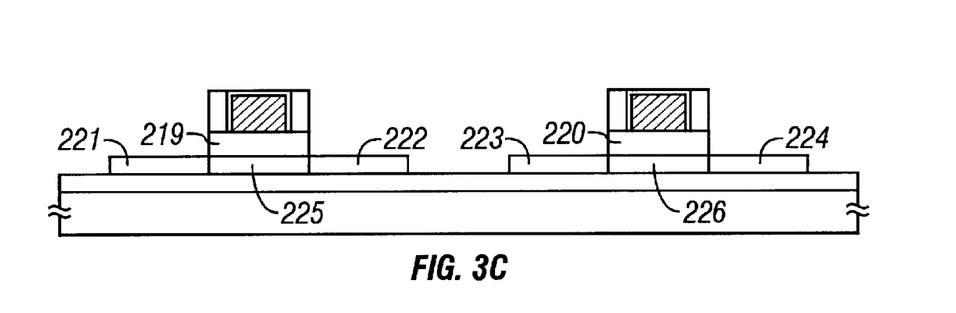
Figure 3D:
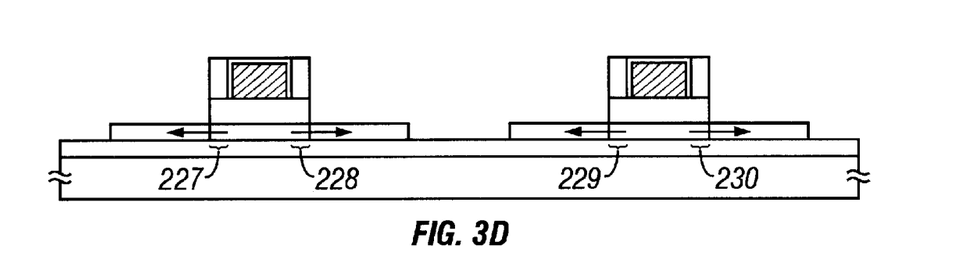

Then, after the resist mask (not shown) is removed, anodization is again performed to form 800-Å-thick anodic oxide films 216 and 218.

An electrolyte used in this step is one obtained by neutralizing, with aqueous ammonia, an ethylene glycol solution containing tartaric acid at 3%. The anodic oxide films 216 and 218 are dense and of a barrier type in film quality.

In this step, the electrolyte goes into the porous anodic oxide films 213 and 214 and hence the dense anodic oxide films 216 and 218 are formed on the surfaces of aluminum patterns 215 and 217 (see FIG. 3B).

The residual aluminum patterns 215 and 217 will serve as gate electrodes of the PTFT and the NTFT, respectively. The state of FIG. 3B is thus obtained.

Subsequently, the exposed part of the silicon oxide film 210 is removed by dry etching, to leave silicon oxide films 219 and 220 as shown in FIG. 3C.

In this state, phosphorus is implanted by plasma doping (or ion doping) so that the total amount of introduced phosphorus becomes larger than that of the nickel element remaining in the films. Practically, this may be done by measuring in advance the concentration of the nickel element remaining in the films and setting the doping conditions so that the phosphorus concentration becomes 10 times or more larger than the measured concentration of the nickel element.

In this step, the phosphorus element is accelerated and implanted into regions 221–224. Regions 225 and 226 are not doped with the phosphorus element.

A heat treatment is then performed at 600° C. for 2 hours in a nitrogen atmosphere. In this step, the nickel element moves from the region 225 to the regions 221 and 222 and from the region 226 to the regions 223 and 224, as indicated by arrows in FIG. 3D.

This heat treatment can be performed at a temperature between 300° C. (preferably 450° C.) and the strain point of the substrate 201.

The removal of the nickel element in this step is concentrated in regions 227–230.

For example, as for the region 225, the movement of the nickel element starts from the regions 227 and 228 that are adjacent to the regions 221 and 222, respectively. A final ratio of nickel sucked out of the regions 227 and 228 into the regions 221 and 222 is maximum among final ratios of nickel sucked out of portions of the region 225.

In the above manner, the nickel element is moved from the region 225 to the regions 221 and 222 and from the region 226 to the regions 223 and 224 (gettering).

The effect of the gettering will be described with reference to FIG. 8, which shows SIMS (secondary ion mass spectroscopy) measurement results.

Figure 8:
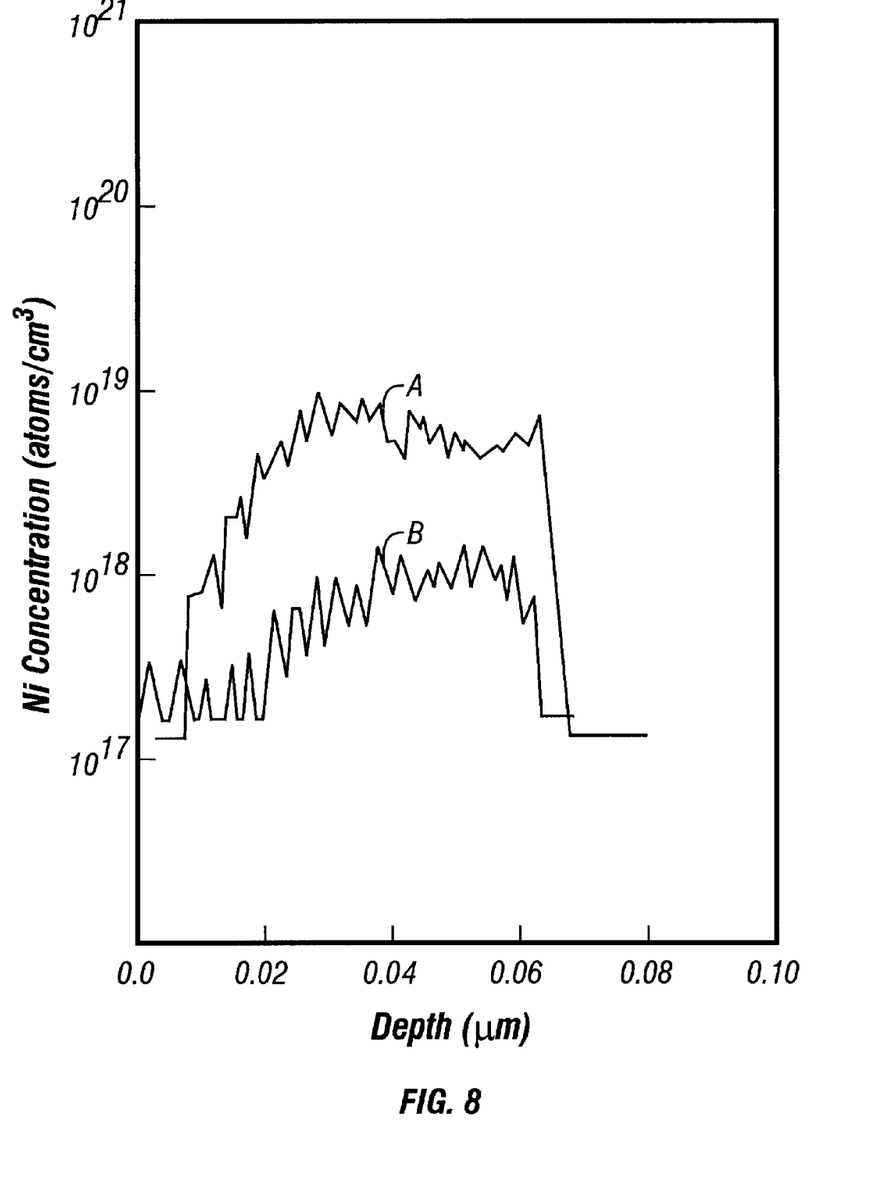
FIG. 8 is a graph showing nickel concentrations in a phosphorus-doped region and a phosphorus-undoped region.

In FIG. 8, characters A and B denote nickel concentrations after completion of the steps concerned in a region doped with phosphorus and a region not doped with phosphorus, respectively.

As seen from FIG. 8, nickel moves from the phosphorus-undoped region to the phosphorus-doped region. On average, the nickel concentration of the phosphorus-doped region is about five times or more larger than that of the phosphorus-undoped region. According to knowledge of the inventors, the effect of the nickel gettering is remarkable when the movement of the nickel element is in such a degree.

After completion of the step of FIG. 3D, phosphorus doping is again performed in the state of FIG. 4A to form source and drain regions of the NTFT.

In this step, regions 231, 235, 236, and 240 are heavily doped to become $n^+$ regions and regions 232, 234, 237, and 239 are lightly doped to become $n^-$ regions.

The light doping occurs due to the existence of the silicon oxide films 219 and 220. That is, when ions are accelerated and implanted, part of the ions are interrupted by the silicon oxide films 219 and 220.

Then, after a resist mask 241 is formed as shown in FIG. 4B, boron doping is performed this time. As a result, the conductivity type of the regions 231 and 235 is inverted to $p^+$ and that of the regions 232 and 234 is inverted to $p^-$.

The doped regions are then activated by illumination with laser light.

A source region 231, a drain region 235, a channel region 233, and low-concentration impurity regions 232 and 234 of the PTFT are thus formed. Further, a source region 240, a drain region 236, a channel region 238, and low-concentration impurity regions 237 and 239 of the NTFT are obtained.

In the PTFT and NTFT having the above structures, the residual nickel element has been removed most thoroughly in the low-concentration impurity regions 232, 234, 237 and 239.

Among those low-concentration impurity regions, an electric field particularly tends to concentrate in the drain-side regions 234 and 237. Therefore, the structure of this embodiment in which the nickel element is removed with priority from the low-concentration impurity regions is very favorable in suppressing the influences of the existence of the nickel element on the device operation.

Laser annealing is performed after completion of the doping, and then a silicon oxide film 242, a silicon nitride film 243, and a polyimide resin film 244 are formed as an interlayer insulating film as shown in FIG. 4C. A resin film made of polyamide, polyimideamide, acrylic, epoxy, or the like may be used instead of the polyimide resin film 244.

Then, after contact holes are formed, a source electrode 245 and a drain electrode 246 of the PTFT and a source electrode 248 and a drain electrode 247 of the NTFT are formed.

A CMOS structure is obtained by connecting the drain electrode 246 of the PTFT and the drain electrode 247 of the NTFT.

By employing the manufacturing process of this embodiment, TFTs having superior and stable device characteristics can be formed on a glass substrate with small variations in device characteristics.

Figure 7A:
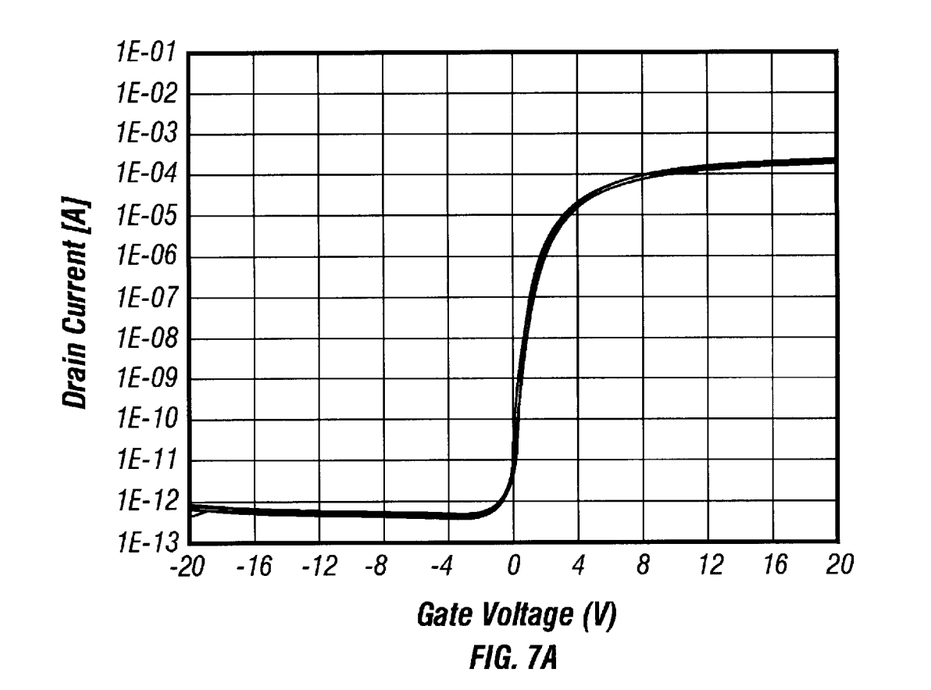
FIGS. 7A and 7B show characteristics of TFTs produced.

FIG. 7A shows an example of the characteristics of an NTFT formed by the manufacturing process of this embodiment. The variations in characteristics are small as exemplified by FIG. 7A.

Figure 7B:
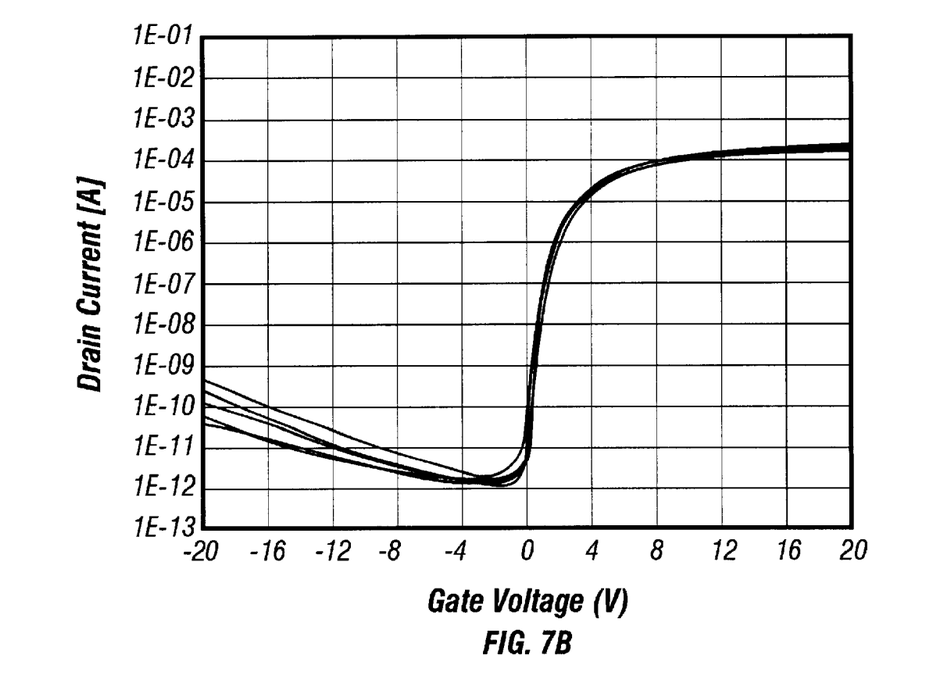

On the other hand, FIG. 7B shows an example of the characteristics of an NTFT formed by a manufacturing process that was the same as the manufacturing process of this embodiment except that the steps of FIGS. 3C and 3D were omitted. As seen from FIG. 7B, the characteristics (particularly the off characteristic) have large variations. This is considered due to the nickel element remaining at a high concentration in the drain-side low-concentration impurity regions.

Embodiment 2

This embodiment is directed to a manufacturing process for forming a crystalline silicon film which process is different than in the first embodiment. Crystal growth of this embodiment is called, for convenience, vertical growth (as opposed to the lateral growth).

Figure 5A:
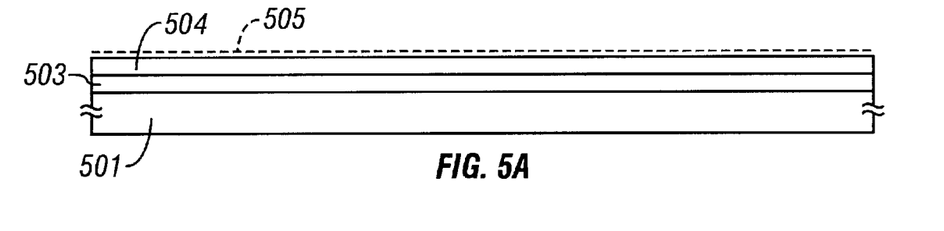
FIGS. 5A–5D show a manufacturing process of a thin-film transistor according to a second embodiment of the invention.

FIGS. 5A–5D shows a manufacturing process of this embodiment. First, as shown in FIG. 5A, a silicon oxide film 503 as an undercoat film is formed on a glass substrate 501. An amorphous silicon film 504 is then formed.

Thereafter, a nickel acetate salt solution whose density has been adjusted to a given value is applied to the entire surface of the amorphous silicon film 504 and an excessive part of the solution is removed by a spin coater.

In this manner, the nickel element is held in contact with the entire surface of the amorphous silicon film 504 as indicated by numeral 505 (see FIG. 5A).

A heat treatment is then performed at 600° C. for 4 hours in a nitrogen atmosphere. In this step, the amorphous silicon film 504 is crystallized to become a crystalline silicon film 506 (see FIG. 5B).

Figure 5B:
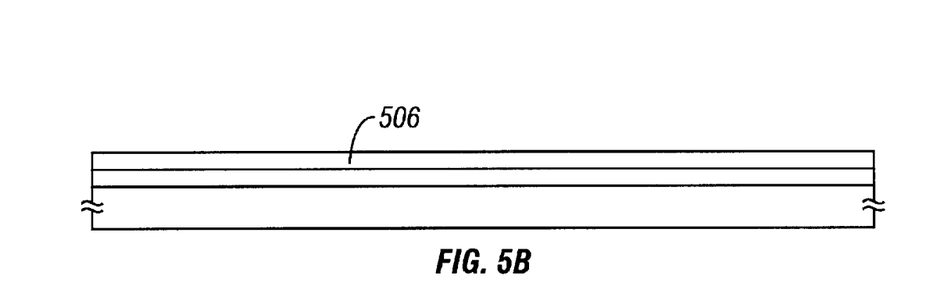
Figure 5C:
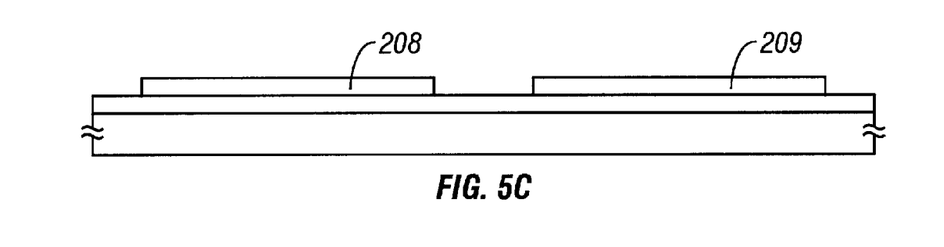
Figure 5D:
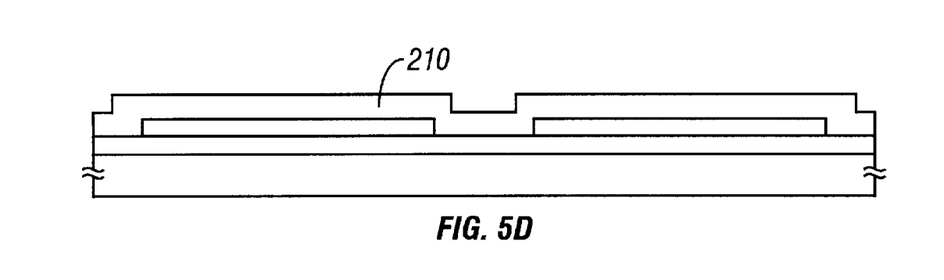

This crystallization proceeds in the entire area of the amorphous silicon film 504 at the same time. Although this crystallizing method is simpler and more convenient than in the first embodiment, resulting characteristics of a TFT are inferior to those of a TFT formed by the method (lateral growth) of the first embodiment.

After the state of FIG. 5B is obtained, patterns 208 and 209 to become the active layers of a PTFT and an NTFT, respectively, are formed as shown in FIG. 2C. The TFTs are completed by the same steps as in the first embodiment.

Embodiment 3

A manufacturing process of this embodiment is different from that of the first or second embodiment in that a crystalline silicon film obtained is illuminated with laser light. To produce laser light, a KrF excimer laser (wavelength: 248 nm), a XeCl excimer laser (wavelength: 308 nm), or the like may be used.

Where the laser light illumination is performed in addition to the heat treatment, a margin in the reproducibility of the process can be increased.

By performing the laser illumination after the crystallization by heating, nickel elements are dispersed in the film and thereby rendered easier to move. This is favorable for the ensuing gettering step.

Strong light such as infrared light may be applied instead of laser light. For example, such a means as RTA (rapid thermal annealing) may also be used.

Embodiment 4

This embodiment is directed to a manufacturing process for forming a crystalline silicon film which process is different than in the first and second embodiments.

This embodiment relates to a combination of a metal element removing means disclosed in Japanese Patent Application No. 8-335152 and the present invention.

The above application discloses a method for removing a metal element from a silicon film by a heat treatment of as high a temperature as more than 900° C. Although this method requires use of a highly heat-resistant substrate as typified by a quartz substrate, it can produce a device that is high in both performance and reliability.

By applying the present invention to the above method, the reliability of a device can further be improved and variations in characteristics can further be reduced.

A manufacturing method will be described below briefly. First, a 500-Å-thick amorphous silicon film is formed on a quartz substrate by low-pressure CVD. The amorphous silicon film is then crystallized by the steps of FIGS. 2A and 2B, to become a crystalline silicon film.

Then, after the surface of the crystalline silicon film is exposed, a heat treatment is performed at 950° C. for 30 minutes in an oxygen atmosphere containing HCl at 3 volume percent.

During this heat treatment, nickel is combined with chlorine and removed from the film in the form of nickel chloride. Further, a thermal oxidation film is formed at a thickness of 300 Å, as a result of which the thickness of the silicon film decreases to 350 Å.

Further, the crystallinity of the film is drastically improved in association with the formation of the thermal oxidation film. This is considered due to a phenomenon that unstable silicon atoms are used for the formation of the thermal oxidation film with priority and hence interstitial atoms and defects decrease in number.

The thus-formed thermal oxidation film is then removed, to leave a crystalline silicon film having a decreased concentration of the nickel element. Thereafter, TFTs are formed by the steps of FIG. 2C onward.

Although basically the above manufacturing process can sufficiently remove the nickel element from the silicon film, there still remains a possibility that the nickel element remains at such a concentration as may cause a problem when devices are further miniaturized. This is because when the device size becomes on the micrometer order or even smaller, the existence of a very small amount of impurity elements (particularly metal elements) comes to greatly influence the device characteristics.

In such a case, the execution of the step of FIG. 3D is very effective. That is, removing the nickel element from a region where the existence of the nickel element will be problematic is effective.

In this embodiment, since the quartz substrate is used, at least part of the gate insulating film may be constituted of a thermal oxidation film. Using a thermal oxidation film as the gate insulating film is effective in improving the device characteristics.

Embodiment 5

A manufacturing process of this embodiment is a combination of the steps of FIGS. 5A–5D and a step of removing the nickel element by forming a thermal oxidation film.

In this embodiment, a quartz substrate is used as the substrate 501, and a heat treatment is performed in an oxygen atmosphere containing HCl at 3 volume percent after completion of thermal crystallization utilizing the nickel element.

In this embodiment, the metal element is removed from the entire area of the silicon film after the thermal crystallization and the metal element is also removed from regions where the existence of the metal element is unfavorable in a TFT forming step like the one shown in FIG. 3D. Therefore, there can be obtained such advantages as improvements in device characteristics and reliability as well as reduction in variations.

Embodiment 6

In this embodiment, apparatuses that utilize the invention will be described briefly. FIGS. 6A–6F outline the respective apparatuses.

Figure 6A:
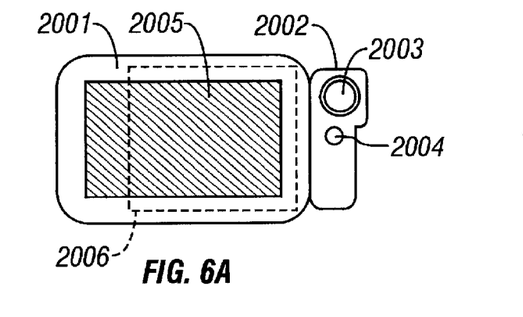
FIGS. 6A–6F schematically show apparatuses according to a sixth embodiment of the invention.

FIG. 6A shows a portable information processing terminal having a function of performing communication via telephone lines.

In this electronic apparatus, an integrated circuit 2006 that uses TFTs is incorporated in a main body 2001. The electronic circuit further has an active matrix liquid crystal display 2005, a camera section 2002 for capturing an image, and a manipulation switch 2004.

Figure 6B:
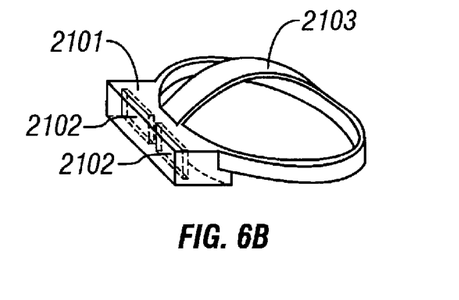

FIG. 6B shows an electronic apparatus called a head-mounted display, which has a function of virtually displaying an image in front of the eyes when a main body 2101 is mounted on a head with a band 2103. An image is formed by liquid crystal display devices 2102 corresponding to the respective eyes.

Circuits using TFTs are employed in this type of electronic apparatus to reduce its size and weight.

Figure 6C:
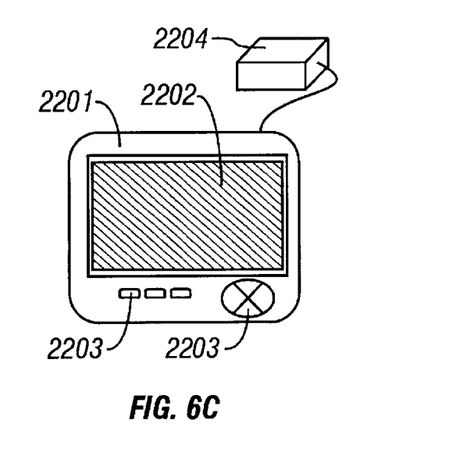

FIG. 6C shows a car navigation apparatus. This electronic apparatus has a function of displaying map information and other various kinds of information based on signals transmitted from an artificial satellite. Information transmitted from the satellite and received by an antenna 2204 is processed by electronic circuits incorporated in a main body 2201 and necessary information is displayed on a liquid crystal display device 2202.

The apparatus is manipulated through manipulation switches 2203. Circuits using TFTs are employed also in this type of apparatus to reduce the entire size.

Figure 6D:
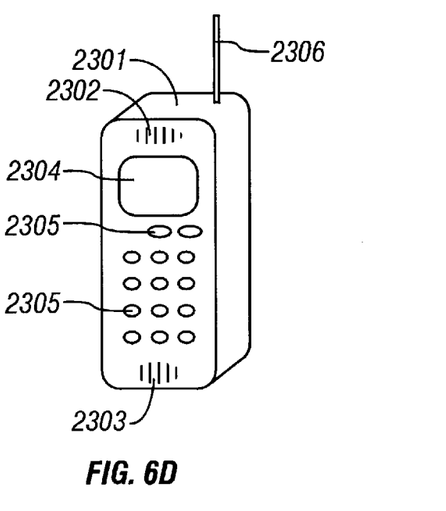

FIG. 6D shows a portable telephone. In this electronic apparatus, a main body 2301 is provided with an antenna 2306, a voice output section 2302, a liquid crystal display device 2304, manipulation switches 2305, and a voice input section 2303.

Figure 6E:
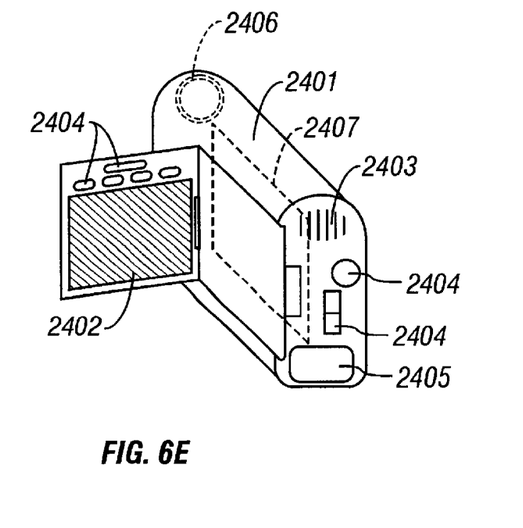

An electronic apparatus shown in FIG. 6E is a portable imaging apparatus called a video camera. In this electronic apparatus, a main body 2401 has, on an opening/closing member, a liquid crystal display 2402 and manipulation switches 2404.

The main body 2401 is further provided with an image receiving section 2406, integrated circuits 2407, a sound input section 2403, manipulation switches 2404, and a battery 2405.

Figure 6F:
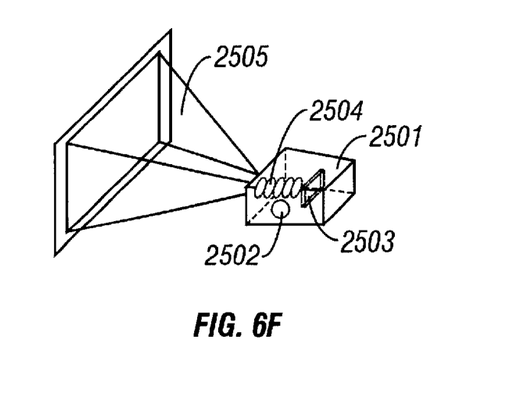

An electronic apparatus shown in FIG. 6F is a projection liquid crystal display device. In this apparatus, a main body 2501 is provided with a light source 2502, a liquid crystal display device 2503, and an optical system 2504. This apparatus has a function of projecting an image onto a screen 2505.

The liquid crystal display device used in each of the above electronic apparatuses may be of either a transmission type or a reflection type. The transmission type is advantageous in terms of display characteristics while the reflection type is advantageous for the purpose of lowering the power consumption or reducing the size and weight.

Flat panel displays such as an active matrix EL display and a plasma display can be used as the display device.

By utilizing the invention, a TFT having small variation in device characteristics can be obtained by using a crystalline silicon film formed by utilizing a metal element.

What is claimed is:

1. A semiconductor device comprising:
   a crystalline semiconductor film having at least a channel region, a drain region, and a lightly doped drain region located between the channel region and the drain region, said drain region and said lightly doped drain region comprising at least one impurity selected from a p-type impurity and an n-type impurity; and
   a gate electrode located adjacent to said channel region with an insulating film interposed therebetween,
   wherein said crystalline semiconductor film comprises at least one metal element promoting crystallization of the semiconductor film;
   wherein a first concentration of said metal element in said lightly doped drain region is one fifth or less that of a second concentration of said metal element in said drain region; and
   wherein a third concentration of said at least one impurity in said drain region is higher than said second concentration.

2. The semiconductor device according to claim 1 wherein said drain region has p-type conductivity and said lightly doped drain region has lower p-type conductivity than the drain region, and wherein the drain region comprises phosphorus.

3. The semiconductor device according to claim 1 wherein said metal element is nickel.

4. The semiconductor device according to claim 1 wherein said metal element is one or more elements selected from the group consisting of Fe, Co, Ni, Ru, Rh, Pd, Os, Ir, Pt, Cu and Au.

5. The semiconductor device according to claim 1 wherein said crystalline semiconductor film comprises $Si_xGe_{1-x}$ where x is more than 0 and less than 1.

6. A portable information processing terminal comprising a display device, said display device comprising:
   a crystalline semiconductor film having at least a channel region, a drain region and a lightly doped drain region located between the channel region and the drain region, said drain region and said lightly doped drain region comprising an impurity element for imparting one conductivity type; and
   a gate electrode located adjacent to said channel region with an insulating film interposed therebetween,
   wherein said crystalline semiconductor film comprises at least one metal element and a first concentration of said metal element in said lightly doped drain region is one fifth or less of a second concentration of said metal element in said drain region, and
   wherein a third concentration of said impurity element in said drain region is higher than said second concentration.

7. A portable information processing terminal according to claim 6 wherein said display device is selected from a transmission type liquid crystal display device, a reflection type liquid crystal display device, an EL display device and a plasma display device.

8. A portable information processing terminal according to claim 6 wherein said crystalline semiconductor film comprises $Si_xGe_{1-x}$ where x is more than 0 and less than 1.

9. A portable information processing terminal according to claim 6 wherein said metal element is one or more elements selected from the group consisting of Fe, Co, Ni, Ru, Rh, Pd, Os, Ir, Pt, Cu and Au.

10. A portable information processing terminal according to claim 6 wherein said resin film comprising an element selected from the group consisting of polyimide, polyamide, polyimideamide, acrylic and epoxy.

11. A portable information processing terminal according to claim 6 wherein said third concentration becomes 10 times or more higher than said second concentration.

12. A head-mounted display comprising a display device, said display device comprising:
   a crystalline semiconductor film having at least a channel region, a drain region and a lightly doped drain region located between the channel region and the drain region, said drain region and said lightly doped drain region comprising an impurity element for imparting one conductivity type; and
   a gate electrode located adjacent to said channel region with an insulating film interposed therebetween,
   wherein said crystalline semiconductor film comprises at least one metal element and a first concentration of said metal element in said lightly doped drain region is one fifth or less of a second concentration of said metal element in said drain region, and
   wherein a third concentration of said impurity element in said drain region is higher than said second concentration.

13. A head-mounted display according to claim 12 wherein said display device is selected from a transmission type liquid crystal display device, a reflection type liquid crystal display device, an EL display device and a plasma display device.

14. A head-mounted display according to claim 12 wherein said crystalline semiconductor film comprises $Si_xGe_{1-x}$ where x is more than 0 and less than 1.

15. A head-mounted display according to claim 12 wherein said metal element is one or more elements selected from the group consisting of Fe, Co, Ni, Ru, Rh, Pd, Os, Ir, Pt, Cu and Au.

16. A head-mounted display according to claim 12 wherein said resin film comprising an element selected from the group consisting of polyimide, polyamide, polyimideamide, acrylic and epoxy.

17. A head-mounted display according to claim 12 wherein said third concentration becomes 10 times or more higher than said second concentration.

18. A car navigation apparatus comprising a display device, said display device comprising:
   a crystalline semiconductor film having at least a channel region, a drain region and a lightly doped drain region located between the channel region and the drain region, said drain region and said lightly doped drain region comprising an impurity element for imparting one conductivity type; and
   a gate electrode located adjacent to said channel region with an insulating film interposed therebetween,
   wherein said crystalline semiconductor film comprises at least one metal element and a first concentration of said metal element in said lightly doped drain region is one fifth or less of a second concentration of said metal element in said drain region, and
   wherein a third concentration of said impurity element in said drain region is higher than said second concentration.

19. A car navigation apparatus according to claim 18 wherein said display device is selected from a transmission type liquid crystal display device, a reflection type liquid crystal display device, an EL display device and a plasma display device.

20. A car navigation apparatus according to claim 18 wherein said crystalline semiconductor film comprises $Si_xGe_{1-x}$ where x is more than 0 and less than 1.

21. A car navigation apparatus according to claim 18 wherein said metal element is one or more elements selected from the group consisting of Fe, Co, Ni, Ru, Rh, Pd, Os, Ir, Pt, Cu and Au.

22. A car navigation apparatus according to claim 18 wherein said resin film comprising an element selected from the group consisting of polyimide, polyamide, polyimideamide, acrylic and epoxy.

23. A car navigation apparatus according to claim 18 wherein said third concentration becomes 10 times or more higher than said second concentration.

24. A portable telephone comprising a display device, said display device comprising:
   a crystalline semiconductor film having at least a channel region, a drain region and a lightly doped drain region located between the channel region and the drain region, said drain region and said lightly doped drain region comprising an impurity element for imparting one conductivity type; and
   a gate electrode located adjacent to said channel region with an insulating film interposed therebetween,
   wherein said crystalline semiconductor film comprises at least one metal element and a first concentration of said metal element in said lightly doped drain region is one fifth or less of a second concentration of said metal element in said drain region, and
   wherein a third concentration of said impurity element in said drain region is higher than said second concentration.

25. A portable telephone according to claim 24 wherein said display device is selected from a transmission type liquid crystal display device, a reflection type liquid crystal display device, an EL display device and a plasma display device.

26. A portable telephone according to claim 24 wherein said crystalline semiconductor film comprises $Si_xGe_{1-x}$ where x is more than 0 and less than 1.

27. A portable telephone according to claim 24 wherein said metal element is one or more elements selected from the group consisting of Fe, Co, Ni, Ru, Rh, Pd, Os, Ir, Pt, Cu and Au.

28. A portable telephone according to claim 24 wherein said resin film comprising an element selected from the group consisting of polyimide, polyamide, polyimideamide, acrylic and epoxy.

29. A portable telephone according to claim 24 wherein said third concentration becomes 10 times or more higher than said second concentration.

30. A video camera comprising a display device, said display device comprising:
   a crystalline semiconductor film having at least a channel region, a drain region and a lightly doped drain region located between the channel region and the drain region, said drain region and said lightly doped drain region comprising an impurity element for imparting one conductivity type; and
   a gate electrode located adjacent to said channel region with an insulating film interposed therebetween,
   wherein said crystalline semiconductor film comprises at least one metal element and a first concentration of said metal element in said lightly doped drain region is one fifth or less of a second concentration of said metal element in said drain region, and
   wherein a third concentration of said impurity element in said drain region is higher than said second concentration.

31. A video camera according to claim 30 wherein said display device is selected from a transmission type liquid crystal display device, a reflection type liquid crystal display device, an EL display device and a plasma display device.

32. A video camera according to claim 30 wherein said crystalline semiconductor film comprises $Si_xGe_{1-x}$ where x is more than 0 and less than 1.

33. A video camera according to claim 30 wherein said metal element is one or more elements selected from the group consisting of Fe, Co, Ni, Ru, Rh, Pd, Os, Ir, Pt, Cu and Au.

34. A video camera according to claim 30 wherein said resin film comprising an element selected from the group consisting of polyimide, polyamide, polyimideamide, acrylic and epoxy.

35. A video camera according to claim 30 wherein said third concentration becomes 10 times or more higher than said second concentration.

36. A projection device comprising a display device, said display device comprising:
   a crystalline semiconductor film having at least a channel region, a drain region and a lightly doped drain region located between the channel region and the drain region, said drain region and said lightly doped drain region comprising an impurity element for imparting one conductivity type; and
   a gate electrode located adjacent to said channel region with an insulating film interposed therebetween,
   wherein said crystalline semiconductor film comprises at least one metal element and a first concentration of said metal element in said lightly doped drain region is one fifth or less of a second concentration of said metal element in said drain region, and
   wherein a third concentration of said impurity element in said drain region is higher than said second concentration.

37. A projection device according to claim 36 wherein said display device is selected from a transmission type liquid crystal display device, a reflection type liquid crystal display device, an EL display device and a plasma display device.

38. A projection device according to claim 36 wherein said crystalline semiconductor film comprises $Si_xGe_{1-x}$ where x is more than 0 and less than 1.

39. A projection device according to claim 36 wherein said metal element is one or more elements selected from the group consisting of Fe, Co, Ni, Ru, Rh, Pd, Os, Ir, Pt, Cu and Au.

40. A projection device according to claim 36 wherein said resin film comprising an element selected from the group consisting of polyimide, polyamide, polyimideamide, acrylic and epoxy.

41. A projection device according to claim 36 wherein said third concentration becomes 10 times or more higher than said second concentration.

42. The semiconductor device according to claim 1 wherein said device is an EL display device.

43. A semiconductor device comprising:
   a crystalline semiconductor film having at least a channel region, a drain region and a lightly doped drain region located between the channel region and the drain region, said drain region and said lightly doped drain region comprising an impurity element for imparting one conductivity type; and a gate electrode located adjacent to said channel region with an insulating film interposed therebetween, wherein said crystalline semiconductor film comprises at least one metal element and a first concentration of said metal element in said lightly doped drain region is one fifth or less that of a second concentration of said metal element in said drain region, and wherein a third concentration of said impurity element in said drain region is higher than said second concentration.

44. A semiconductor device according to claim 43 wherein said semiconductor device is selected from a transmission type liquid crystal display device, a reflection type liquid crystal display device, an EL display device and a plasma display device.

45. A semiconductor device according to claim 43 wherein said crystalline semiconductor film comprises $Si_xGe_{1-x}$ where x is more than 0 and less than 1.

46. A semiconductor device according to claim 43 wherein said crystalline semiconductor film consists substantially of silicon.

47. A semiconductor device according to claim 43 wherein said metal element is one or more elements selected from the group consisting of Fe, Co, Ni, Ru, Rh, Pd, Os, Ir, Pt, Cu and Au.

48. A semiconductor device according to claim 43 wherein said third concentration becomes 10 times or more higher than said second concentration.

49. A semiconductor device comprising:

a crystalline semiconductor film having at least a channel region, a drain region and a lightly doped drain region located between the channel region and the drain region, said drain region and said lightly doped drain region comprising a p-type impurity, and at least said drain region further comprising phosphorous; and a gate electrode located adjacent to said channel region with an insulating film interposed therebetween, wherein said crystalline semiconductor film comprises at least one metal element and a first concentration of said metal element in said lightly doped drain region is one fifth or less that of a second concentration of said metal element in said drain region, and wherein a third concentration of said phosphorous in said drain region is higher than said second concentration.

50. A semiconductor device according to claim 49 wherein said semiconductor device is selected from a transmission type liquid crystal display device, a reflection type liquid crystal display device, an EL display device and a plasma display device.

51. A semiconductor device according to claim 49 wherein said crystalline semiconductor film comprises $Si_xGe_{1-x}$ where x is more than 0 and less than 1.

52. A semiconductor device according to claim 49 wherein said crystalline semiconductor film consists substantially of silicon.

53. A semiconductor device according to claim 49 wherein said metal element is one or more elements selected from the group consisting of Fe, Co, Ni, Ru, Rh, Pd, Os, Ir, Pt, Cu and Au.

54. A semiconductor device according to claim 49 wherein said third concentration becomes 10 times or more higher than said second concentration.

55. A semiconductor device comprising:

a crystalline semiconductor film having at least a channel region, a drain region and a lightly doped drain region located between the channel region and the drain region, said drain region and said lightly doped drain region comprising an impurity element for imparting one conductivity type;

a gate electrode located adjacent to said channel region with an insulating film interposed therebetween; and an interlayer insulating film comprising a silicon oxide film, a silicon nitride film, and a resin film provided over said crystalline semiconductor film, wherein said drain region further comprises at least one metal element at a first concentration, wherein a second concentration of said impurity element in said drain region is higher than said first concentration, and wherein a third concentration of said metal element in said lightly doped-drain region is one fifth or less that of said first concentration.

56. A semiconductor device according to claim 55 wherein said semiconductor device is selected from a transmission type liquid crystal display device, a reflection type liquid crystal display device, an EL display device and a plasma display device.

57. A semiconductor device according to claim 55 wherein said crystalline semiconductor film comprises $Si_xGe_{1-x}$ where x is more than 0 and less than 1.

58. A semiconductor device according to claim 55 wherein said crystalline semiconductor film consists substantially of silicon.

59. A semiconductor device according to claim 55 wherein said metal element is one or more elements selected from the group consisting of Fe, Co, Ni, Ru, Rh, Pd, Os, Ir, Pt, Cu and Au.

60. A semiconductor device according to claim 55 wherein said third concentration becomes 10 times or more higher than said second concentration.

61. A semiconductor device according to claim 1 wherein said crystalline semiconductor film consists substantially of silicon.

62. A semiconductor device according to claim 6 wherein said crystalline semiconductor film consists substantially of silicon.

63. A semiconductor device according to claim 12 wherein said crystalline semiconductor film consists substantially of silicon.

64. A semiconductor device according to claim 18 wherein said crystalline semiconductor film consists substantially of silicon.

65. A semiconductor device according to claim 24 wherein said crystalline semiconductor film consists substantially of silicon.

66. A semiconductor device according to claim 30 wherein said crystalline semiconductor film consists substantially of silicon.

67. A semiconductor device according to claim 36 wherein said crystalline semiconductor film consists substantially of silicon.

68. A semiconductor device comprising:

a crystalline semiconductor film having at least a channel region, a drain region and a lightly doped drain region located between said channel region and said drain region, said drain region comprising a n-type impurity and a p-type impurity; and a gate electrode located adjacent to said channel region with an insulating film interposed therebetween, wherein said drain region further comprises at least one metal element at a first concentration, wherein a second concentration of said n-type impurity in said drain region is higher than said first concentration, and wherein a third concentration of said metal element in said lightly doped drain region is one fifth or less that of said first concentration.

69. A semiconductor device according to claim 68 wherein said semiconductor device is selected from a transmission type liquid crystal display device, a reflection type liquid crystal display device, an EL display device and a plasma display device.

70. A semiconductor device according to claim 68 wherein said crystalline semiconductor film comprises $Si_xGe_{1-x}$ where x is more than 0 and less than 1.

71. A semiconductor device according to claim 68 wherein said crystalline semiconductor film consists substantially of silicon.

72. A semiconductor device according to claim 68 wherein said metal element is one or more elements selected from the group consisting of Fe, Co, Ni, Ru, Fh, Pd, Os, Ir, Pt, Cu and Au.

73. A semiconductor device according to claim 68 wherein said third concentration is 10 times or more higher than said second concentration.

74. A semiconductor device according to claim 43 wherein said drain region and said lightly doped region comprises a p-type impurity and wherein said drain region further comprises phosphorus.

75. A semiconductor device according to claim 55 wherein said drain region and said lightly doped region comprises a p-type impurity and wherein said drain region further comprises phosphorus.

76. A semiconductor device according to claim 1, further comprising an interlayer insulating film comprising a silicon oxide film, a silicon nitride film and a resin film provided over said crystalline semiconductor film.

77. A portable information processing terminal according to claim 6, further comprising an interlayer insulating film comprising a silicon oxide film, a silicon nitride film and a resin film provided over said crystalline semiconductor film.

78. A head-mounted display according to claim 12, further comprising an interlayer insulating film comprising a silicon oxide film, a silicon nitride film and a resin film provided over said crystalline semiconductor film.

79. A car navigation apparatus according to claim 18, further comprising an interlayer insulating film comprising a silicon oxide film, a silicon nitride film and a resin film provided over said crystalline semiconductor film.

80. A portable telephone according to claim 24, further comprising an interlayer insulating film comprising a silicon oxide film, a silicon nitride film and a resin film provided over said crystalline semiconductor film.

81. A video camera according to claim 30, further comprising an interlayer insulating film comprising a silicon oxide film, a silicon nitride film and a resin film provided over said crystalline semiconductor film.

82. A projection device according to claim 36, further comprising an interlayer insulating film comprising a silicon oxide film, a silicon nitride film and a resin film provided over said crystalline semiconductor film.

83. A semiconductor device according to claim 43, further comprising an interlayer insulating film comprising a silicon oxide film, a silicon nitride film and a resin film provided over said crystalline semiconductor film.

84. A semiconductor device according to claim 49, further comprising an interlayer insulating film comprising a silicon oxide film, a silicon nitride film and a resin film provided over said crystalline semiconductor film.

85. A semiconductor device according to claim 68, further comprising an interlayer insulating film comprising a silicon oxide film, a silicon nitride film and a resin film provided over said crystalline semiconductor film.

\* \* \* \* \*